(12) United States Patent
Furukawa et al.

(10) Patent No.: US 7,385,839 B2
(45) Date of Patent: Jun. 10, 2008

(54) MEMORY DEVICES USING CARBON NANOTUBE (CNT) TECHNOLOGIES

(75) Inventors: Toshiharu Furukawa, Essex Junction, VT (US); Mark Charles Hakey, Fairfax, VT (US); Steven John Holmes, Guilderland, NY (US); David Vaclav Horak, Essex Junction, VT (US); Charles William Koburger, III, Delmar, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/275,010

(22) Filed: Dec. 1, 2005

(65) Prior Publication Data

US 2007/0133266 A1    Jun. 14, 2007

(51) Int. Cl.
*G11C 11/00* (2006.01)
(52) U.S. Cl. .......................................... 365/151; 438/99
(58) Field of Classification Search ................... 365/51; 438/99
See application file for complete search history.

(56) References Cited

U.S. PATENT DOCUMENTS

| | | | |
|---|---|---|---|
| 6,574,130 B2 * | 6/2003 | Segal et al. ................. | 365/129 |
| 6,643,165 B2 | 11/2003 | Segal et al. | |
| 6,784,028 B2 * | 8/2004 | Rueckes et al. ............. | 438/128 |
| 6,836,424 B2 | 12/2004 | Segal et al. | |
| 6,944,054 B2 * | 9/2005 | Rueckes et al. ............. | 365/177 |
| 6,982,903 B2 * | 1/2006 | Bertin et al. ................. | 365/163 |
| 6,990,009 B2 * | 1/2006 | Bertin et al. ................. | 365/151 |
| 7,071,023 B2 * | 7/2006 | Bertin et al. ................. | 438/99 |
| 7,075,141 B2 * | 7/2006 | Rueckes et al. ............. | 257/316 |
| 7,113,426 B2 * | 9/2006 | Rueckes et al. ....... | 365/185.01 |
| 7,138,832 B2 * | 11/2006 | Bertin et al. ................. | 326/104 |
| 7,155,960 B2 * | 1/2007 | Arii et al. ................... | 73/31.05 |
| 7,164,744 B2 * | 1/2007 | Bertin ......................... | 326/30 |
| 7,167,026 B2 * | 1/2007 | Bertin ......................... | 326/56 |
| 7,176,505 B2 * | 2/2007 | Rueckes et al. ............. | 257/209 |
| 7,196,450 B2 * | 3/2007 | Pinkerton et al. ........... | 310/309 |

FOREIGN PATENT DOCUMENTS

JP        2004165297 A  *  6/2004

* cited by examiner

*Primary Examiner*—Viet Q. Nguyen
(74) *Attorney, Agent, or Firm*—Schmeiser, Olsen & Watts; William D. Sabo

(57) ABSTRACT

Structures and methods for operating the same. The structure includes (a) a substrate; (b) a first and second electrode regions on the substrate; and (c) a third electrode region disposed between the first and second electrode regions. In response to a first write voltage potential applied between the first and third electrode regions, the third electrode region changes its own shape, such that in response to a pre-specified read voltage potential subsequently applied between the first and third electrode regions, a sensing current flows between the first and third electrode regions. In addition, in response to a second write voltage potential being applied between the second and third electrode regions, the third electrode region changes its own shape such that in response to the pre-specified read voltage potential applied between the first and third electrode regions, said sensing current does not flow between the first and third electrode regions.

5 Claims, 17 Drawing Sheets

MEMORY DEVICES USING CARBON NANOTUBE (CNT) TECHNOLOGIES

BACKGROUND OF THE INVENTION

1. Technical Field

The present invention relates to memory devices, and more specifically, to memory devices using carbon nanotube (CNT) technologies.

2. Related Art

In memory cells comprising semiconductor transistors, gate current leakage is becoming a serious problem, demanding for new technologies in fabricating and operating memory cells. Therefore, there is a need for a memory cell structure (and a method for operating the same) that does not have the gate leakage problem of the prior art.

SUMMARY OF THE INVENTION

The present invention provides a structure, comprising (a) a substrate; (b) a first electrode region and a second electrode region on the substrate; and (c) a third electrode region disposed between the first and second electrode regions, wherein, there exists a first write voltage potential such that in response to the first write voltage potential being applied between the first and third electrode regions, the third electrode region changes its own shape, such that in response to a pre-specified read voltage potential being subsequently applied between the first and third electrode regions, a sensing current flows between the first and third electrode regions, wherein, there exists a second write voltage potential such that in response to the second write voltage potential being applied between the second and third electrode regions, the third electrode region changes its own shape such that in response to the pre-specified read voltage potential being applied between the first and third electrode regions, said sensing current does not flow between the first and third electrode regions, and wherein there exists a force such that in response to the force being applied to the third electrode region, the third electrode region changes its own shape and subsequently retains its changed shape even if the force is no longer present.

The present invention also provides a structure, comprising (a) a substrate; (b) a first electrode region and a second electrode region on the substrate; (c) a third electrode region disposed between the first and second electrode regions; and (d) a tunneling dielectric layer disposed between the first and third electrode regions, wherein, there exists a first write voltage potential such that in response to the first write voltage potential being applied between the first and third electrode regions, the third electrode region changes its own shape, such that in response to a pre-specified read voltage potential being subsequently applied between the first and third electrode regions, a sensing current flows between the first and third electrode regions, wherein, there exists a second write voltage potential such that in response to the second write voltage potential being applied between the second and third electrode regions, the third electrode region changes its own shape such that in response to the pre-specified read voltage potential being applied between the first and third electrode regions, said sensing current does not flow between the first and third electrode regions, wherein there exists a force such that in response to the force being applied to the third electrode region, the third electrode region changes its own shape and subsequently retains its changed shape even if the force is no longer present, wherein the third electrode region comprises a carbon nanotube mesh, and wherein in response to the first write voltage potential being applied between the first and third electrode regions, the tunneling dielectric layer prevents the third electrode from coming into direct physical contact with the first electrode region.

The present invention also provides a structure operation method, comprising providing a structure comprising (a) a substrate, (b) a first electrode region and a second electrode region on the substrate, (c) a third electrode region disposed between the first and second electrode regions, and (d) a tunneling dielectric layer disposed between the first and third electrode regions, wherein there exists a force such that in response to the force being applied to the third electrode region, the third electrode region changes its own shape and subsequently retains its changed shape even if the force is no longer present; and applying a first write voltage potential between the first and third electrode regions so as to move portions of the third electrode region towards and into direct physical contact with the tunneling dielectric layer such that in response to a pre-specified read voltage potential being subsequently applied between the first and third electrode regions, a sensing current tunnels between the first and third electrode regions through the tunneling dielectric layer.

The present invention provides a memory cell structure (and a method for operating the same) that does not have the gate leakage problem of the prior art.

DETAILED DESCRIPTION OF THE INVENTION

FIGS. 1-16 show the fabrication process for forming a memory cell 100, in accordance with embodiments of the present invention. In this application, in FIG. N (N=1, 2, . . . , 17), the top portion shows a top-down view, whereas the bottom portion shows a cross-section view of the top portion along the line N-N.

Figure 1:
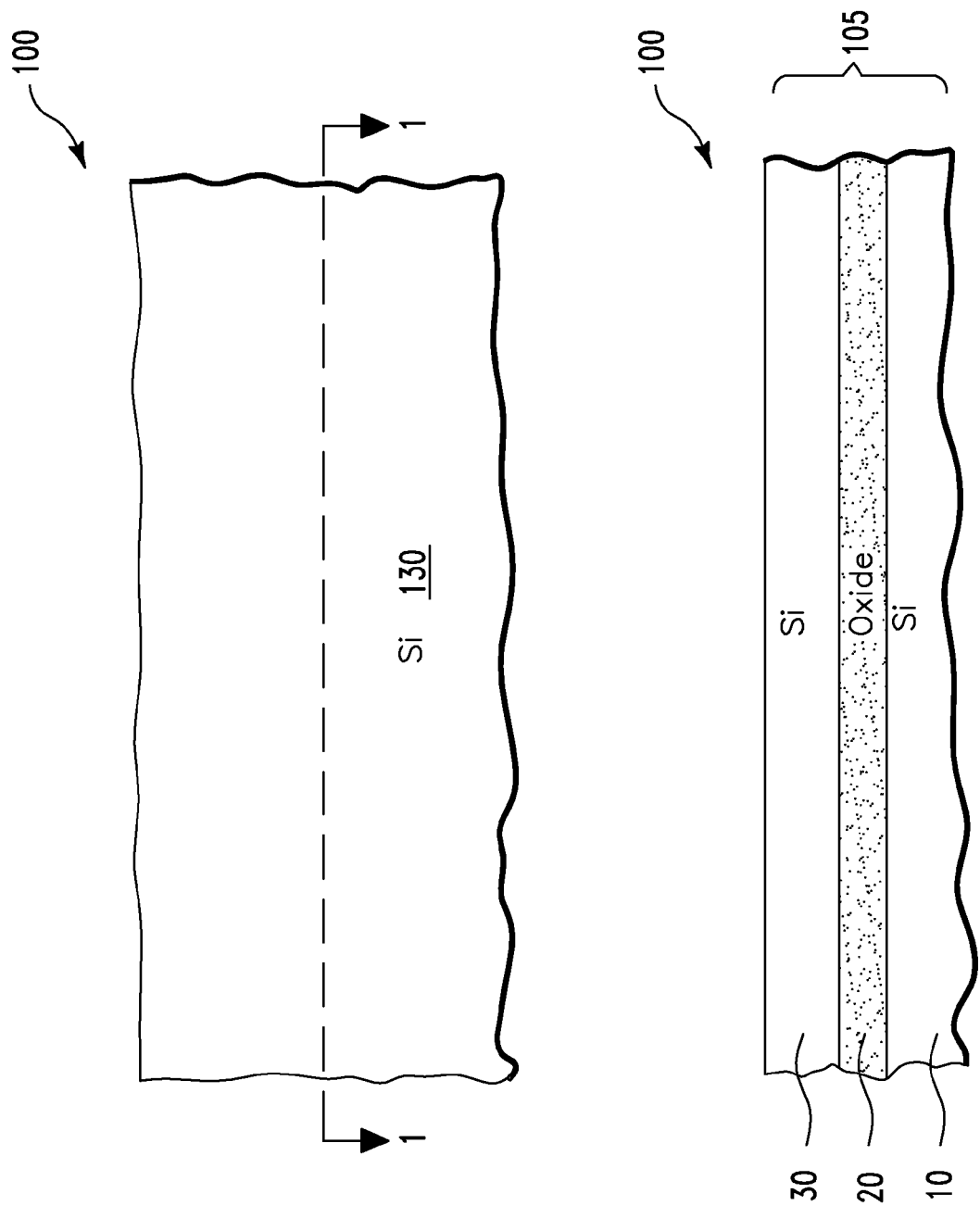
FIGS. 1-16 show the fabrication process for forming a memory cell, in accordance with embodiments of the present invention.

With reference to FIG. 1, in one embodiment, the fabrication process starts out with an SOI (silicon on insulator) substrate 105 comprising (i) a silicon layer 110, (ii) a buried oxide layer 120 on the silicon layer 110, and (iii) a silicon layer 130 on the buried oxide layer 120. For simplicity, the silicon layer 110 is not shown in the later figures. In an alternative embodiment, the fabrication process can start out with a bulk silicon wafer (not shown) instead of with the SOI substrate 105.

Figure 2:
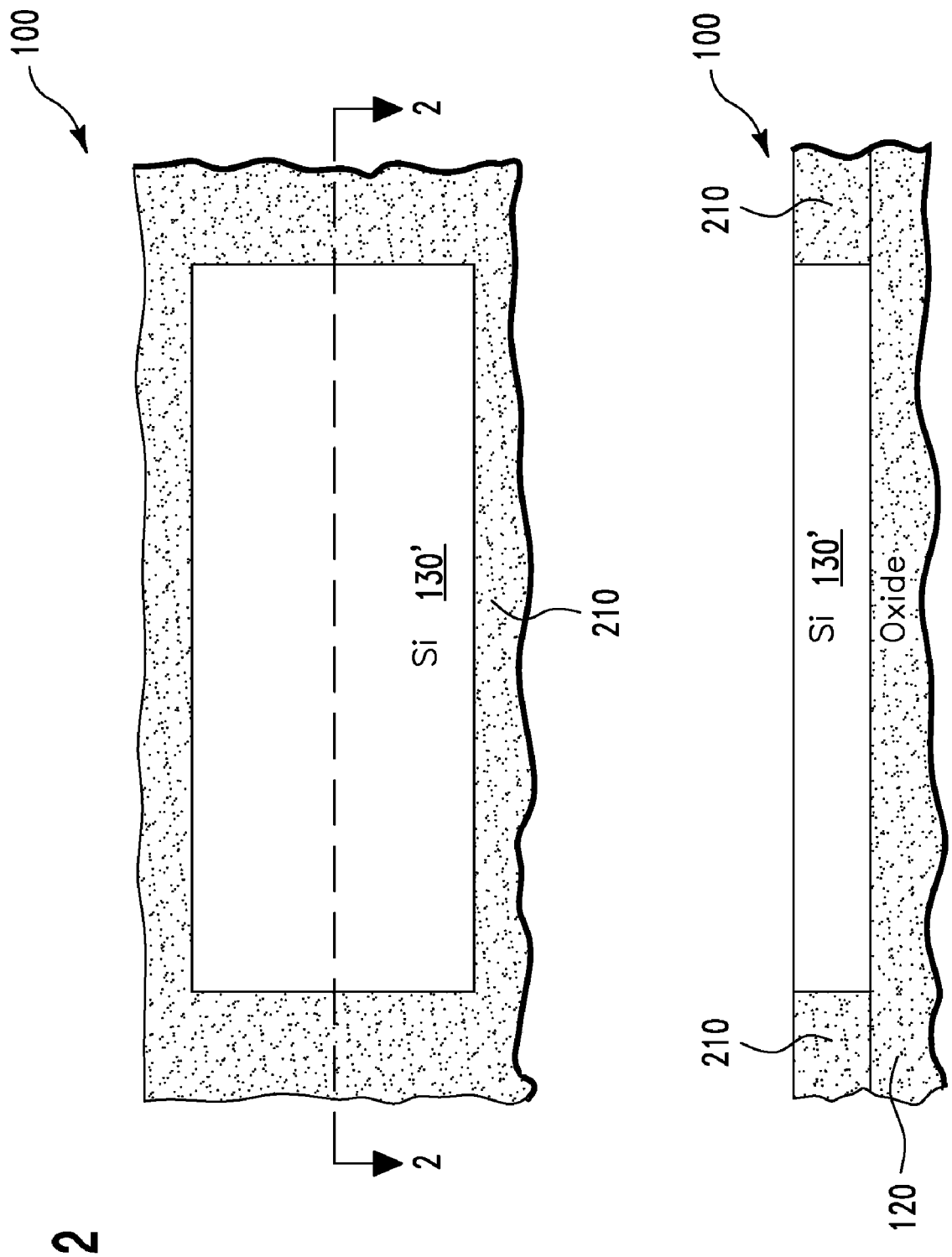

Next, with reference to FIG. 2, in one embodiment, a silicon region 130' of the silicon layer 130 (FIG. 1) is left intact whereas the surrounding regions of the silicon layer 130 (FIG. 1) is replaced by a dielectric (e.g., silicon dioxide) region 210. Illustratively, the memory cell 100 of FIG. 2 is formed by first etching the silicon layer 130 (FIG. 1) except the silicon region 130', using a conventional lithographic and etching process, stopping at the buried oxide layer 120. Next, in one embodiment, silicon dioxide is blanket-deposited, followed by a planarization step (e.g., chemical mechanical polishing—CMP) until the silicon region 130' is again exposed to the surrounding ambient. The resulting memory cell 100 is shown in FIG. 2.

Figure 3:
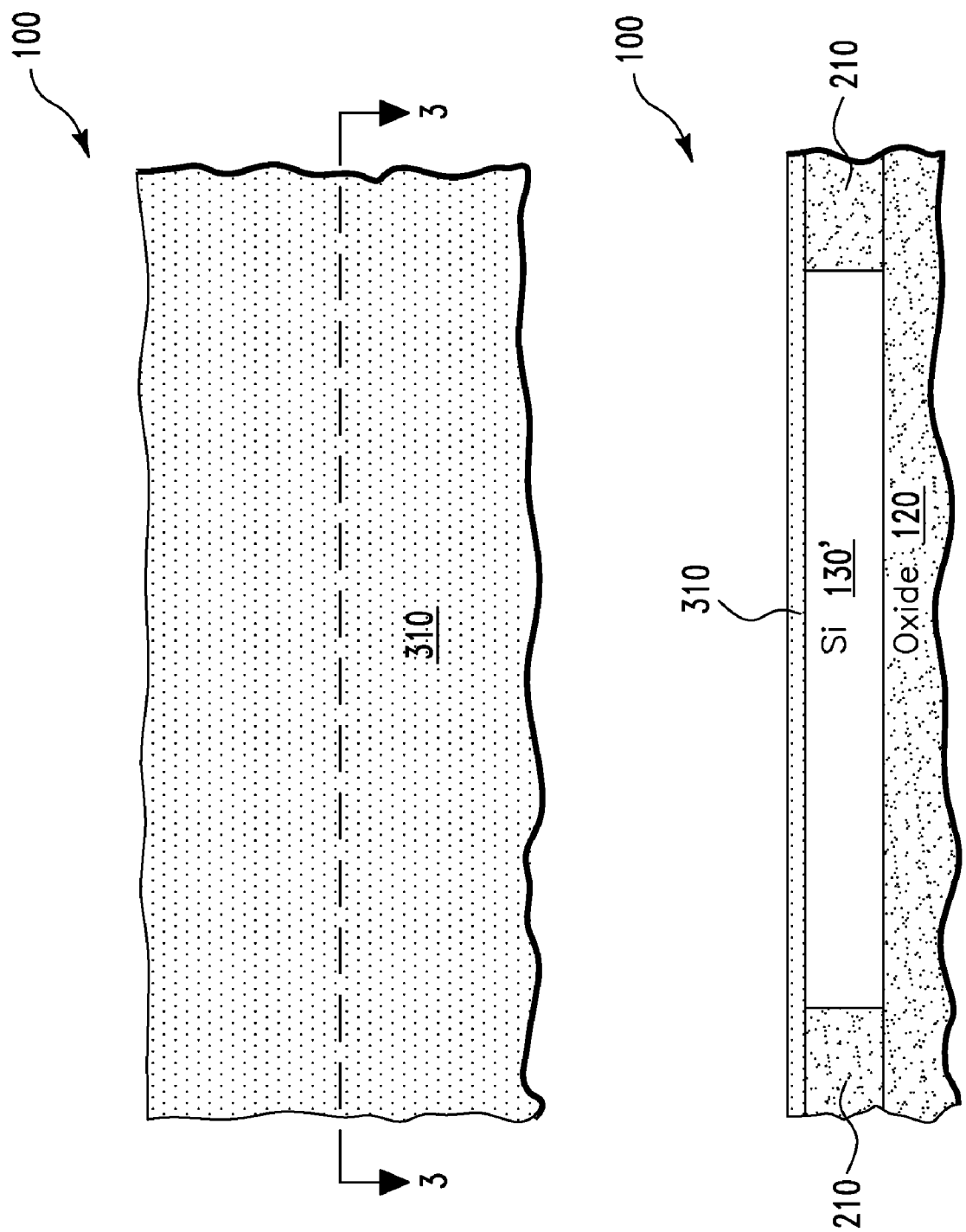

Next, with reference to FIG. 3, in one embodiment, a nitride layer 310 is formed on top of the entire memory cell 100 of FIG. 2, illustratively, by chemical vapor deposition (CVD) of silicon nitride.

Figure 4:
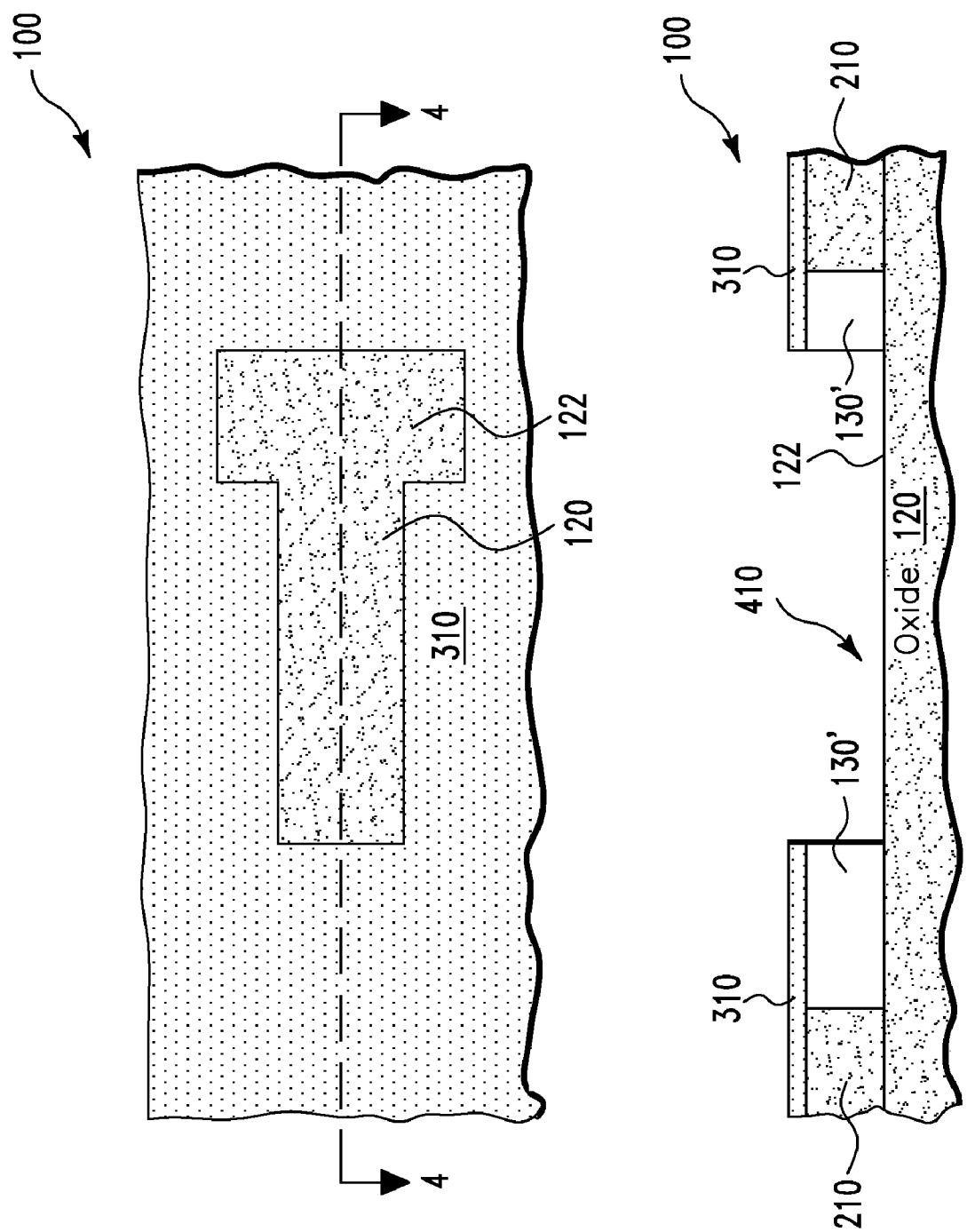

Next, with reference to FIG. 4, in one embodiment, a cavity 410 is created in the nitride layer 310 and the silicon region 130' such that a top surface 122 of the buried oxide layer 120 is exposed to the surrounding ambient via the cavity 410. Illustratively, the cavity 410 is created using a conventional lithographic and etching process. In one embodiment, viewed top-down, the cavity 410 has a T-shape.

Figure 5:
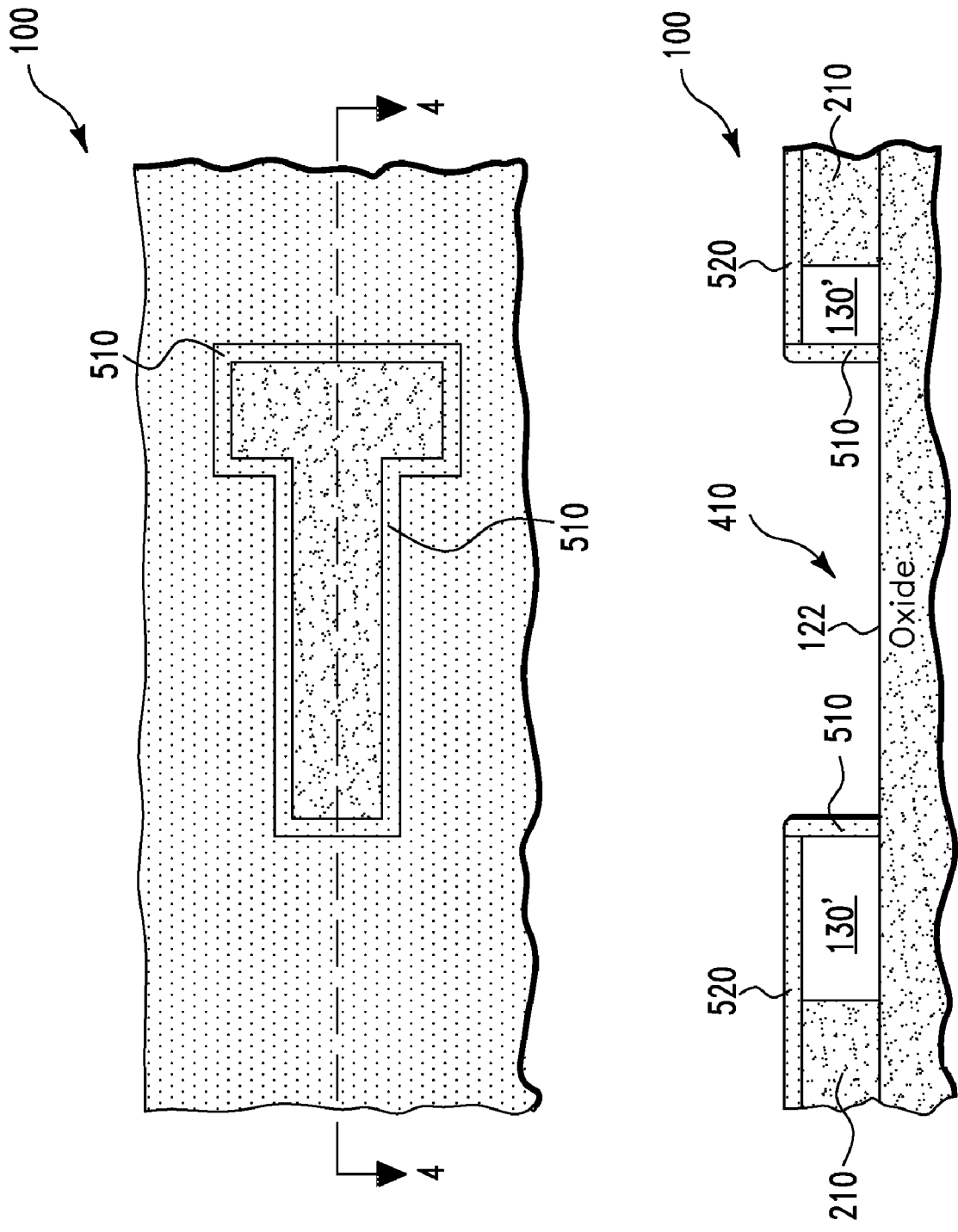

Next, with reference to FIG. 5, in one embodiment, a nitride spacer 510 is formed on side walls of the cavity 410. Illustratively, the nitride spacer 510 is formed by (ii) depositing a nitride material (e.g., silicon nitride) on top of the entire memory cell 100 of FIG. 4, and then (ii) etching back the deposited nitride material resulting in the nitride spacer 510 on the side walls of the cavity 410. In one embodiment, the etching back is performed until the top surface 122 of the buried oxide layer 120 is exposed to the surrounding ambient whereas a nitride layer 520 remains on top of the silicon region 130'.

Figure 6:
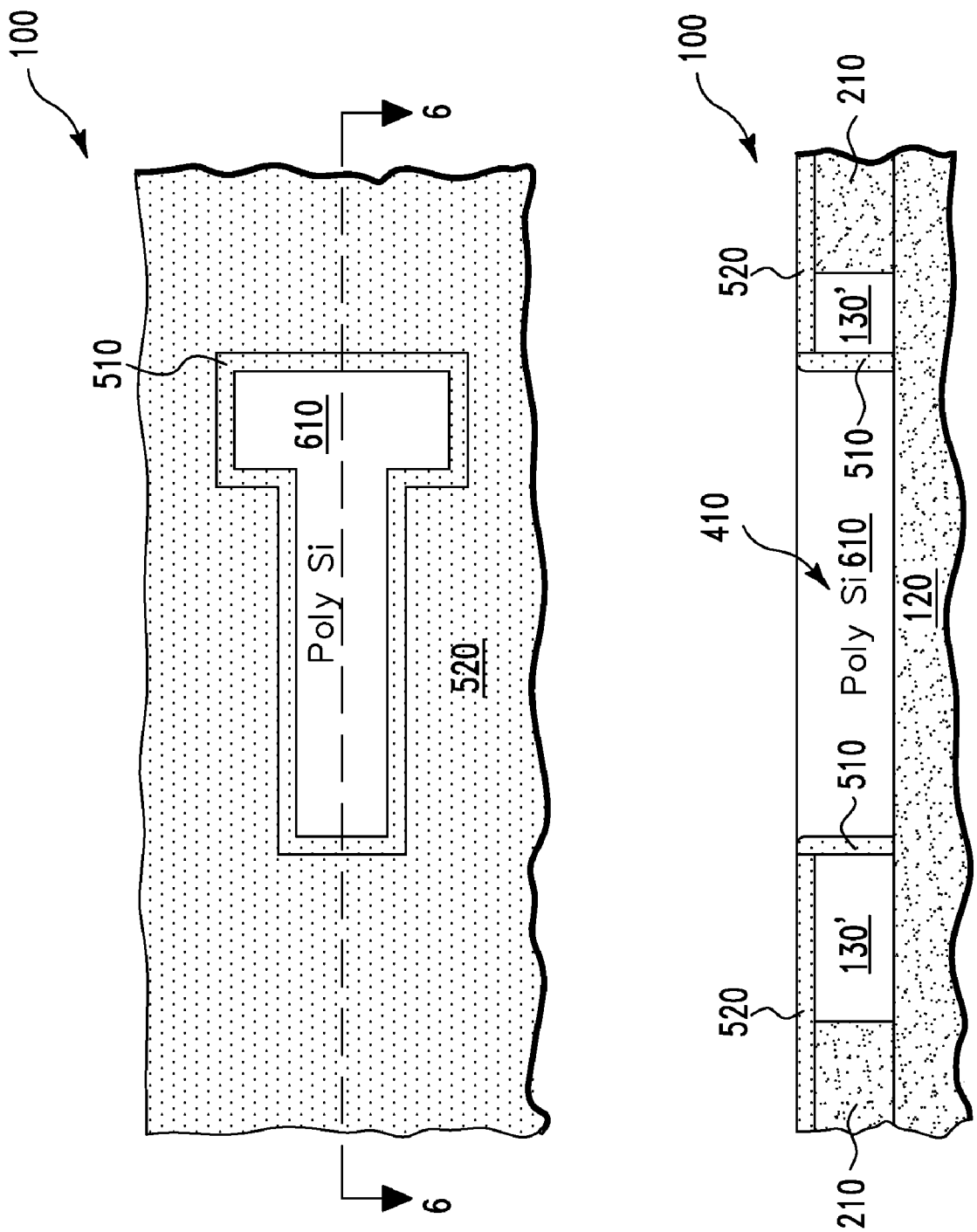

Next, with reference to FIG. 6, in one embodiment, the cavity 410 is filled with an electrically conducting material (e.g., doped polysilicon) so as to form a bottom electrode region 610. Illustratively, the polysilicon bottom electrode region 610 is formed by depositing doped polysilicon on top of the entire memory cell 100 of FIG. 5, followed by a planarizing step (e.g., CMP) until the nitride layer 520 is exposed to the surrounding ambient.

Figure 7:
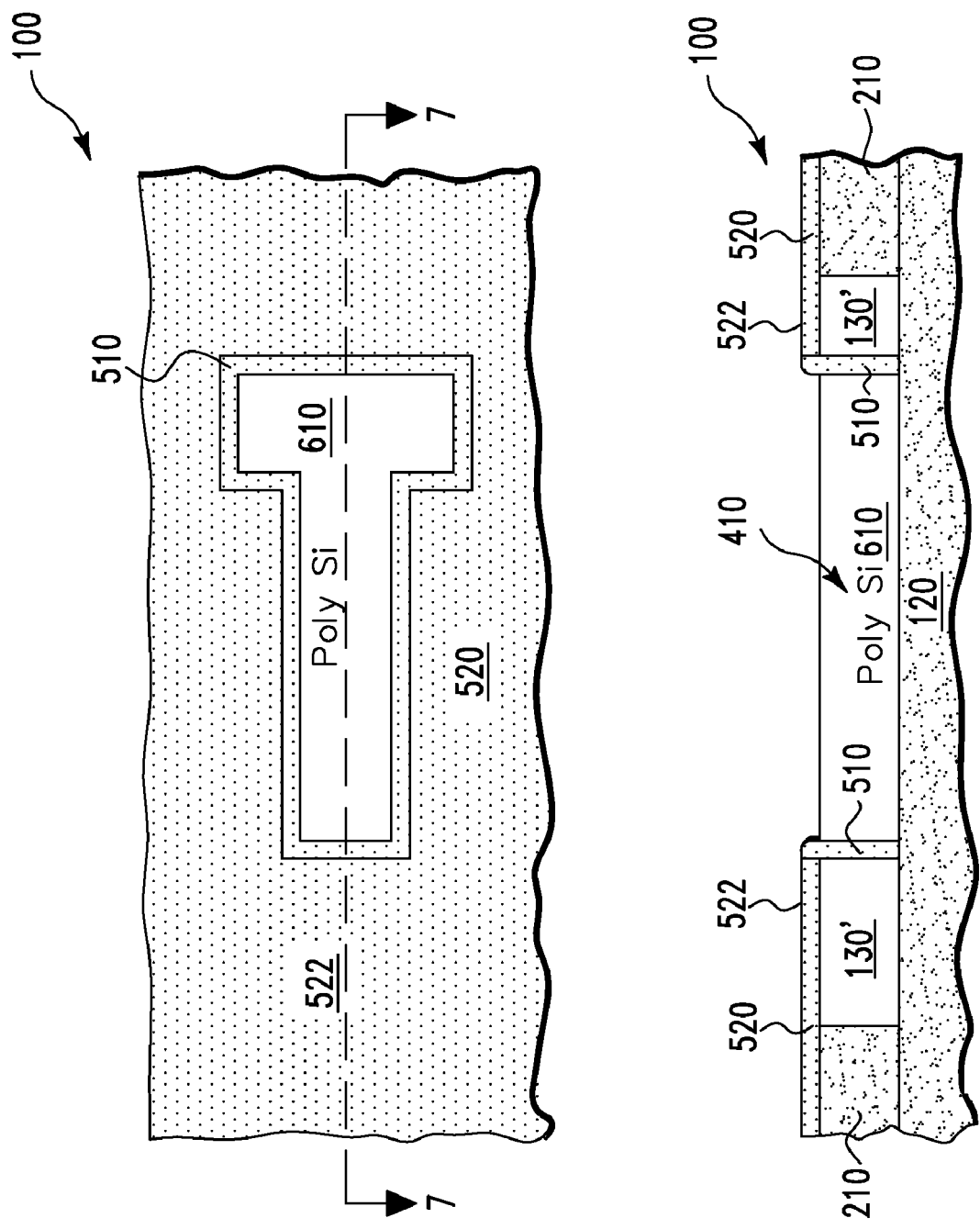

Next, with reference to FIG. 7, in one embodiment, the polysilicon bottom electrode region 610 is recessed such that a top surface 612 of the polysilicon bottom electrode region 610 is at a lower level than a top surface 522 of the nitride layer 520. Illustratively, the polysilicon bottom electrode region 610 is recessed by a short RIE (reactive ion etching with a large isotropic etch component) step which is selective to the nitride material of the regions 510 and 520.

Figure 8:
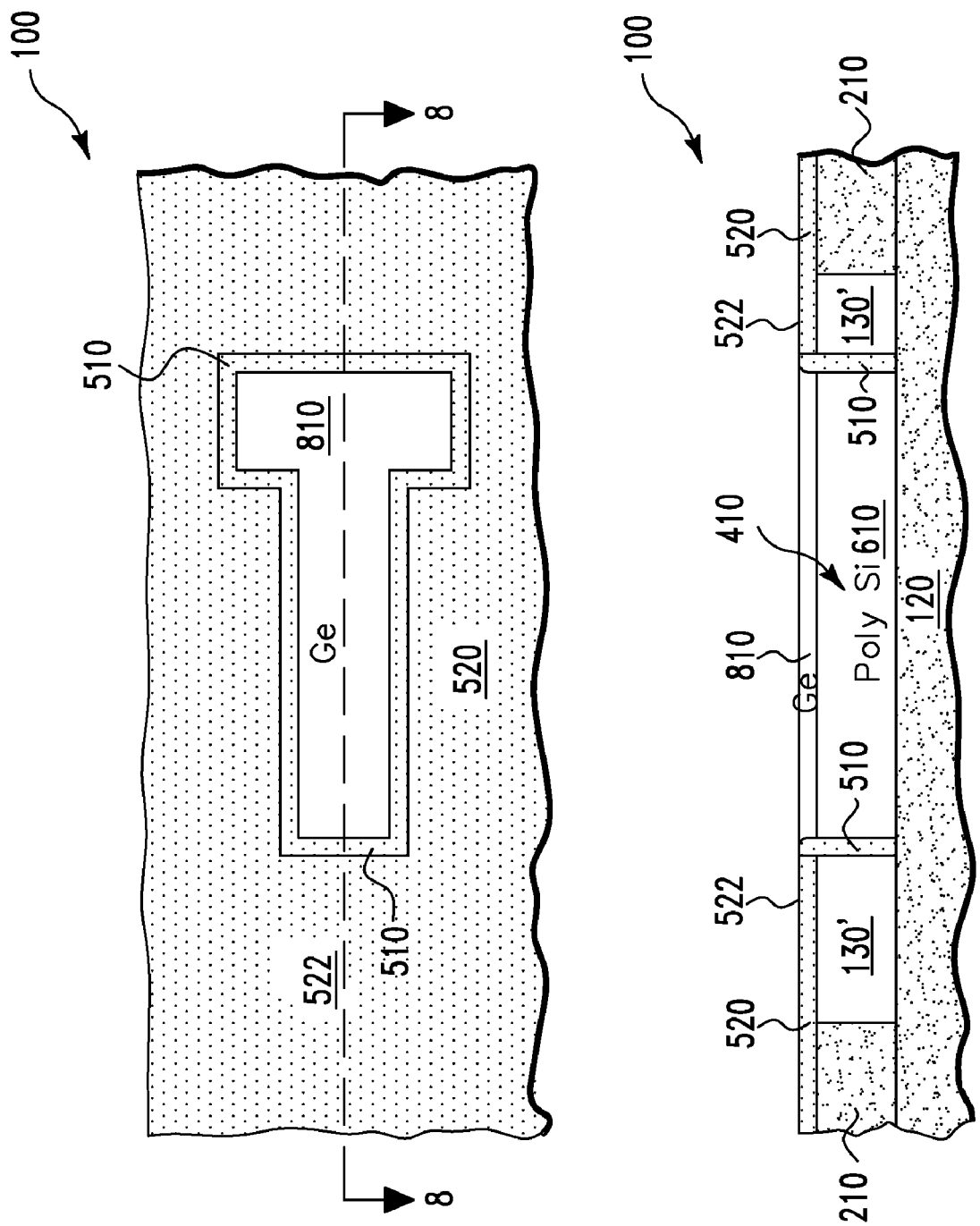

Next, with reference to FIG. 8, in one embodiment, a bottom place holder 810 (comprising illustratively polycrystalline or amorphous germanium Ge) is formed on top of the polysilicon bottom electrode region 610 and in the cavity 410. Illustratively, the Ge bottom place holder 810 is formed by first CVD of Ge on top of the entire memory cell 100 of FIG. 7 and then polishing (e.g., using CMP) the deposited Ge until the top surface 522 of the nitride layer 520 is exposed to the surrounding ambient.

Figure 9:
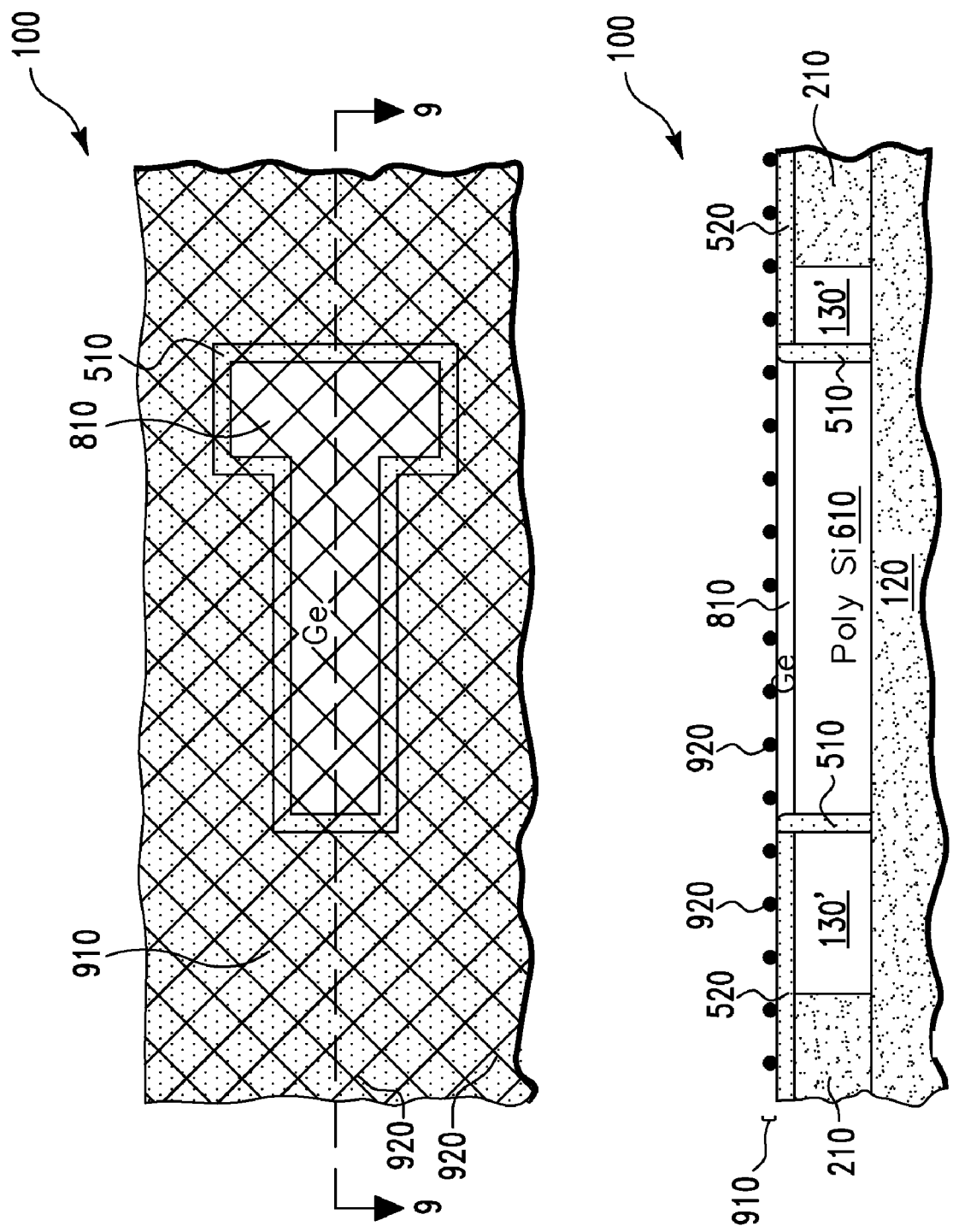

Next, with reference to FIG. 9, in one embodiment, a carbon nanotube (CNT) mesh 910 is formed on top of the entire memory cell 100 of FIG. 8. In one embodiment, the CNT mesh 910 comprises multiple carbon nanotubes 920 physically attached together in random orientations. The CNT mesh 910 has the properties of: (i) electrically conducting and (ii) changing its own shape under a force but retaining that shape even after the force is removed. In general, the CNT mesh 910 can comprise any material that has the two properties (i) and (ii) listed above. Alternative to the property (i) listed above, the material of the CNT mesh 910 can be a mixture of conducting and semiconducting materials preferably mostly a conducting material (e.g., greater than 80% in weight). Illustratively, the CNT mesh 910 is formed by spinning CNTs in a casting solvent on top of the entire memory cell 100 of FIG. 8. Then, the casting solvent evaporates resulting in the CNT mesh 910 as shown in FIG. 9.

Figure 10:
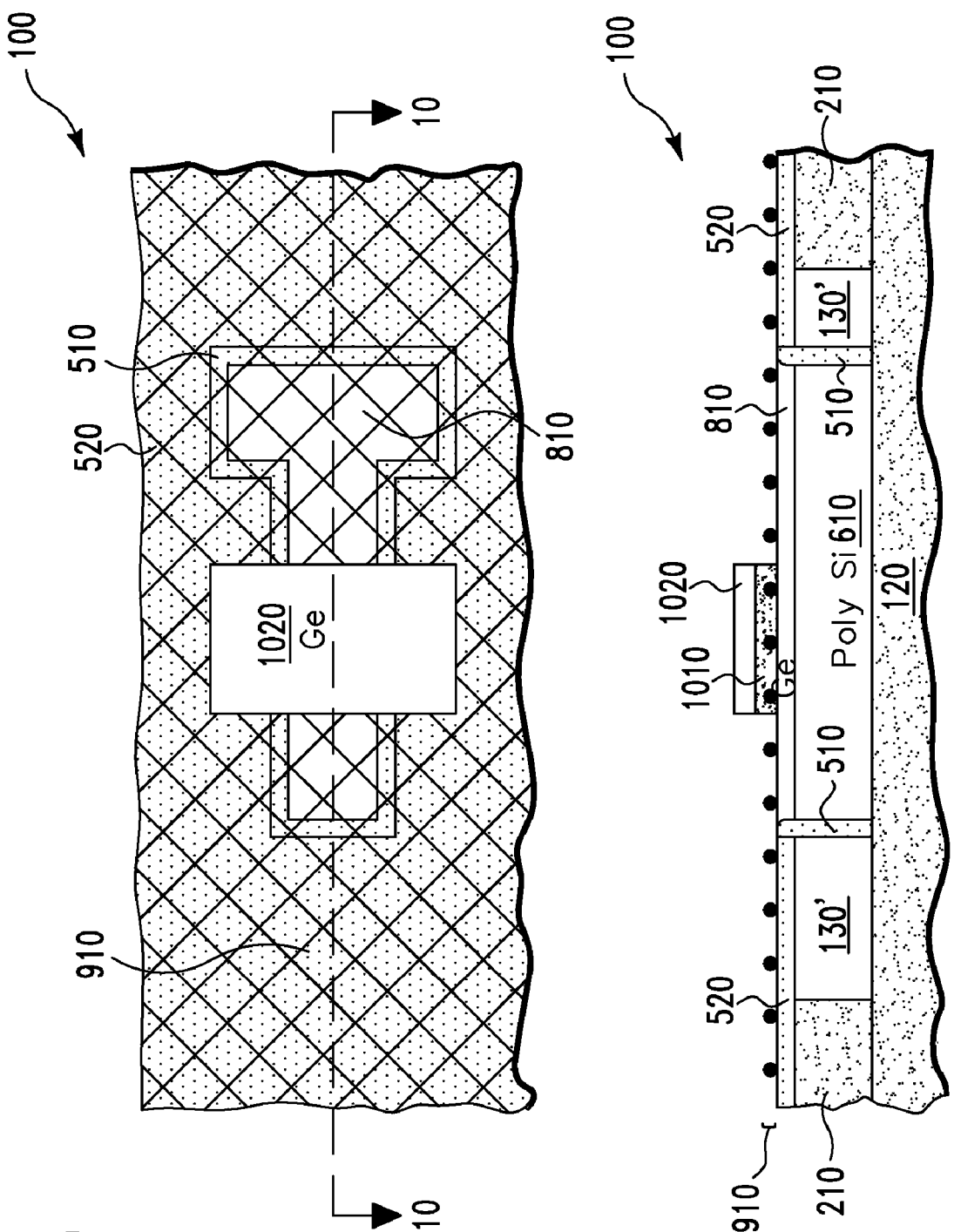

Next, with reference to FIG. 10, in one embodiment, a top place holder 1010,1020 comprising a GeO2 region 1010 and a Ge region 1020 is formed on top of the Ge bottom place holder 810 and the nitride layer 520 such that a portion of the CNT mesh 910 is buried in the GeO2 region 1010. Illustratively, the top place holder 1010,1020 is formed by first forming a GeO2 layer (not shown) on top of the entire memory cell 100 of FIG. 9 by, for example, CVD. Next, a Ge layer (not shown) is formed on top of the deposited GeO2 layer. Next, a lithographic and etching step is performed to etch the Ge layer stopping at the GeO2 layer, resulting in the Ge region 1020. Next, portions of the GeO2 layer not covered by the Ge region 1020 are removed with water, resulting in the GeO2 region 1010. Next, the photoresist layer (not shown) used in the lithographic step above is removed with a solvent. The resulting memory cell 100 is shown in FIG. 10.

Figure 11:
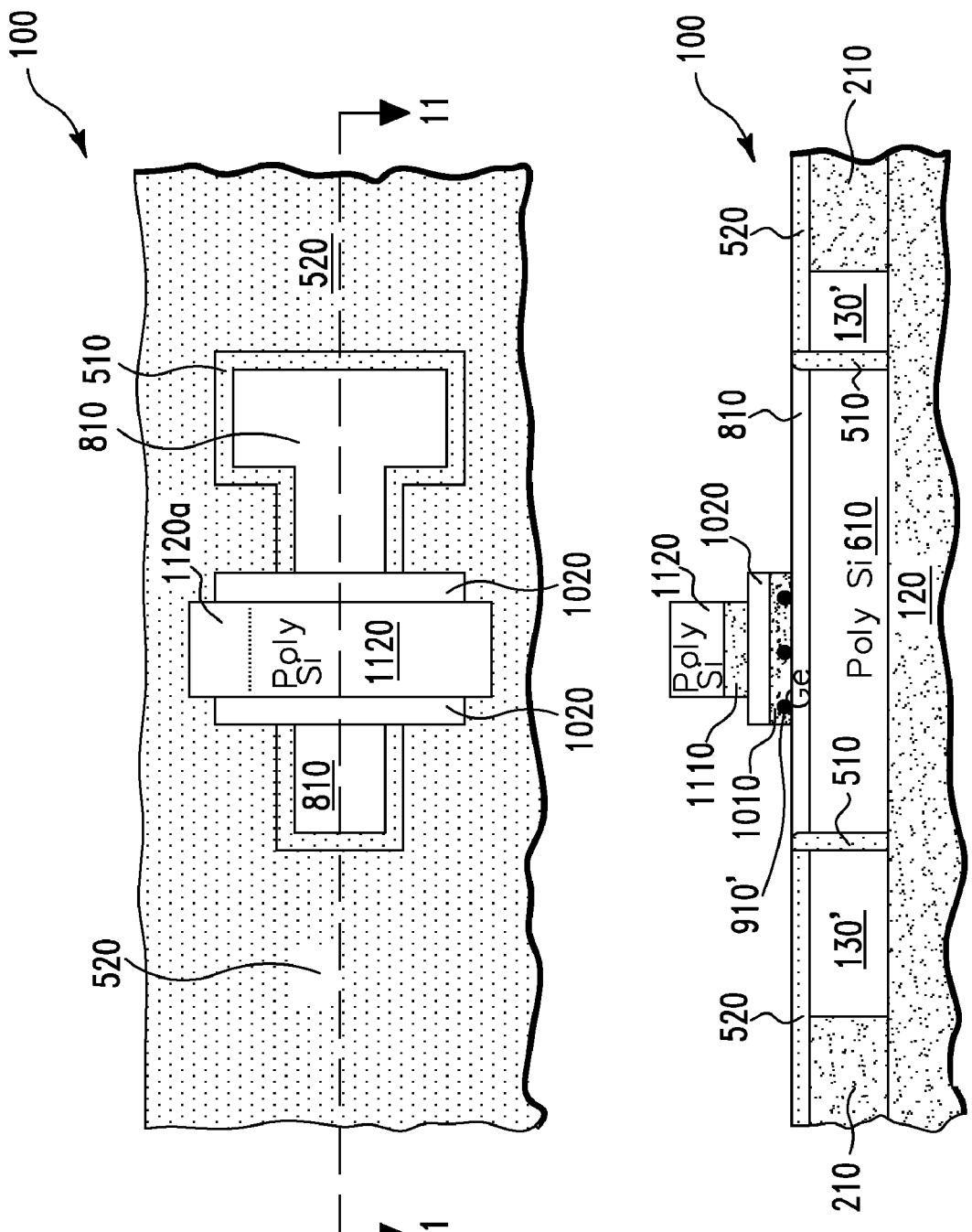

Next, with reference to FIG. 11, in one embodiment, a top electrode stack 1110,1120 comprising a dielectric region 1110 and a top electrode region 1120 is formed on the Ge region 1020 and the nitride layer 520 (see top figure). Illustratively, the dielectric region 1110 comprises silicon dioxide, and the top electrode region 1120 comprises doped polysilicon. In one embodiment, the top electrode stack 1110,1120 is formed by first forming a SiO2 layer (not shown) on top of the entire memory cell 100 of FIG. 10. Next, a polysilicon layer (not shown) is formed on top of the SiO2 layer. Next, a lithographic and etching step is performed to etch the polysilicon layer and then the SiO2 layer, resulting in the polysilicon top electrode region 1120 and the oxide region 1110 in that order.

Next, in one embodiment, exposed-to-ambient portions of the CNT mesh 910 (FIG. 10) are etched away using, illustratively, an oxygen plasma which is selective to the materials of the polysilicon top electrode region 1120 and the Ge regions 1020 and 810. What remains of the CNT mesh 910 (FIG. 10) afterwards is the CNT mesh 910'. The resulting memory cell 100 is shown in FIG. 11.

Figure 12:
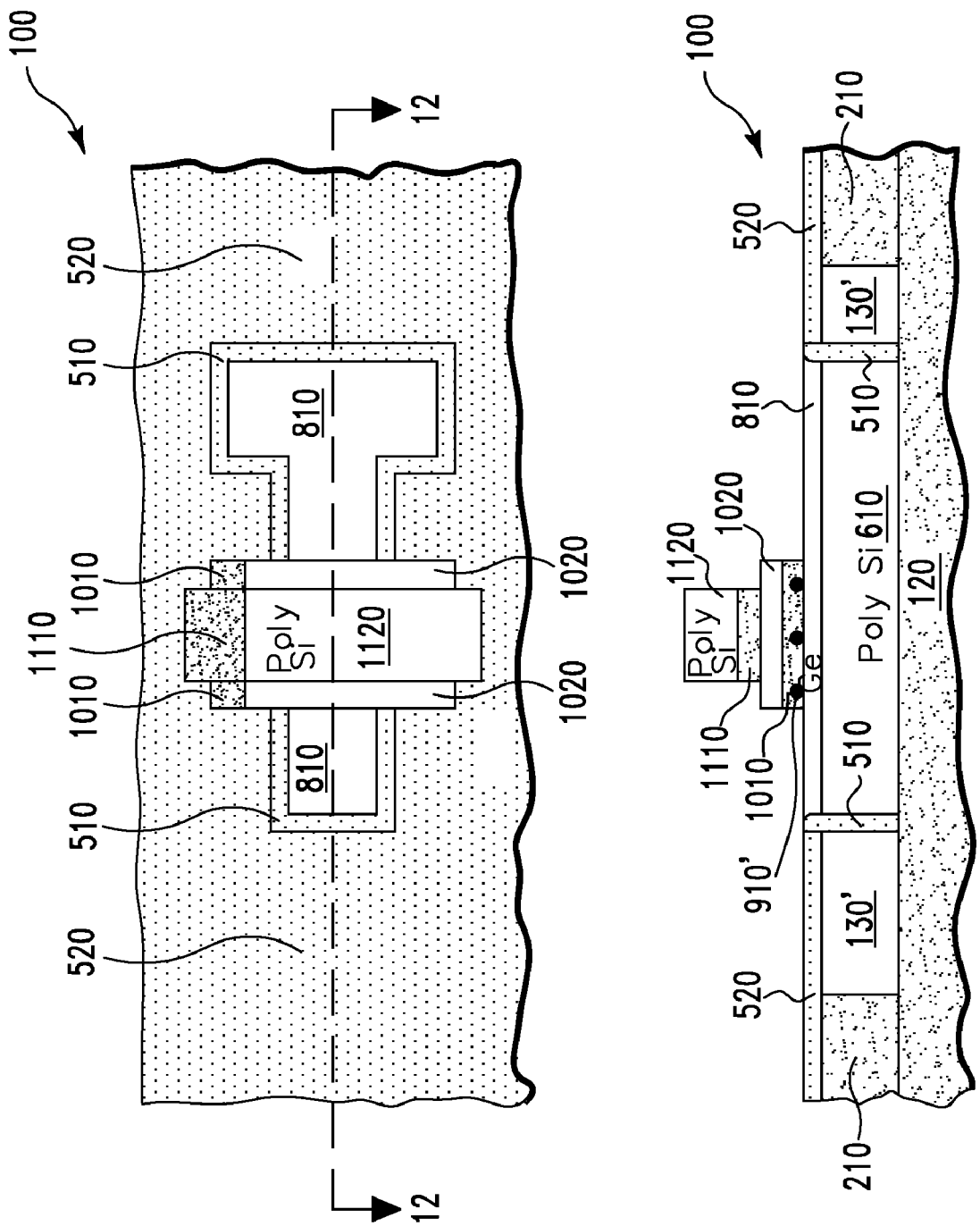

Next, in one embodiment, a portion 1120a of the polysilicon top electrode region 1120 is removed so that a filled contact hole (not shown in FIG. 11, but shown in FIGS. 15-17) can be later formed there such that the filled contact hole is in direct physical contact with the underlying CNT mesh 910' but not in direct physical contact with the polysilicon top electrode region 1120. Illustratively, the portion 1120a of the polysilicon top electrode region 1120 is removed by a lithographic and etching process. It should be noted that removing the polysilicon portion 1120a may also remove some portions of the Ge region 1020 such that portions of the GeO2 region 1010 are exposed to the surrounding ambient (top figure of FIG. 12). The resulting memory cell 100 is shown in FIG. 12.

Figure 13:
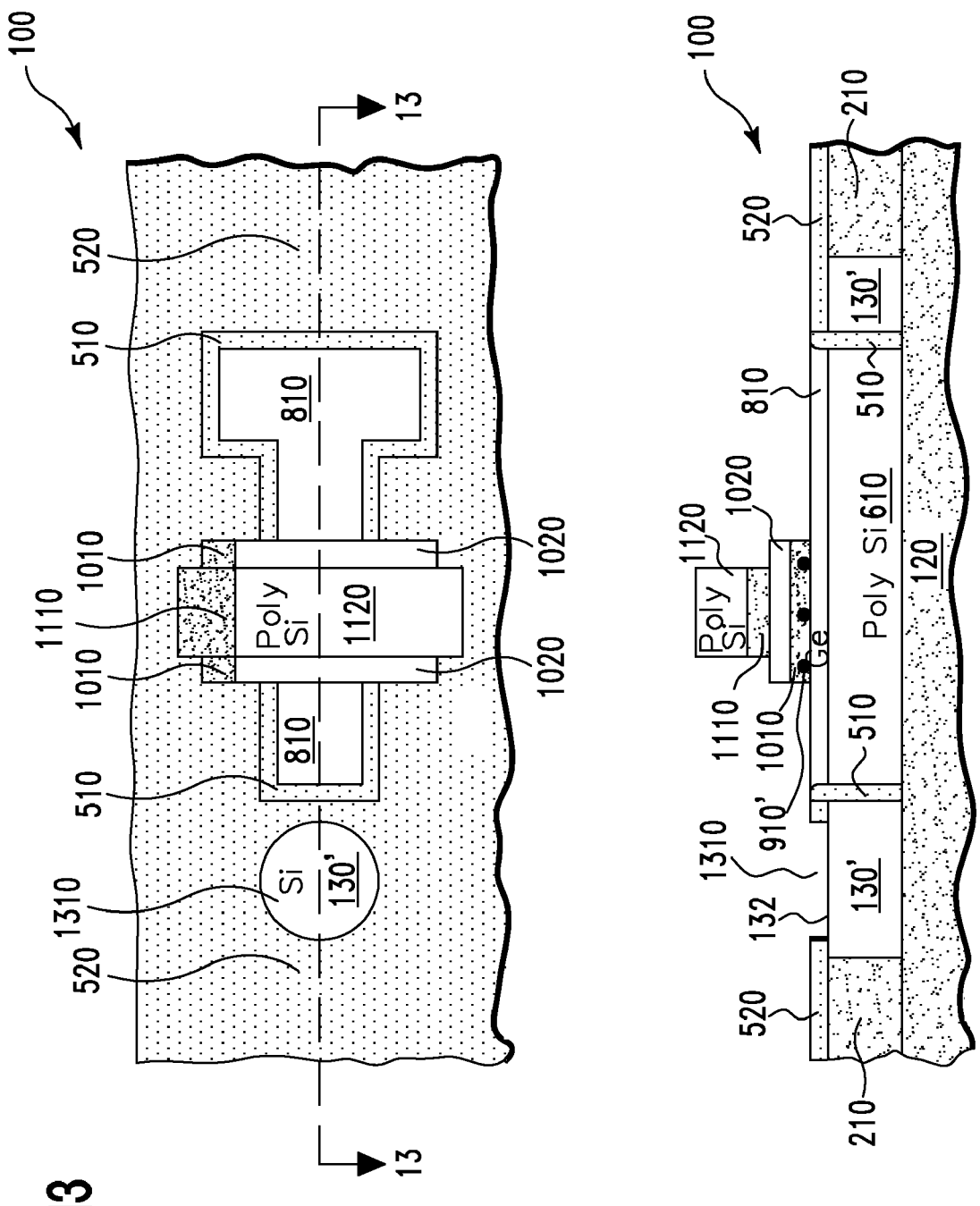

Next, with reference to FIG. 13, in one embodiment, an opening 1310 is created in the nitride layer 520 such that a top surface 132 of the silicon region 130' is exposed to the surrounding ambient. Illustratively, the opening 1310 is created using a lithographic and etching process.

Figure 14:
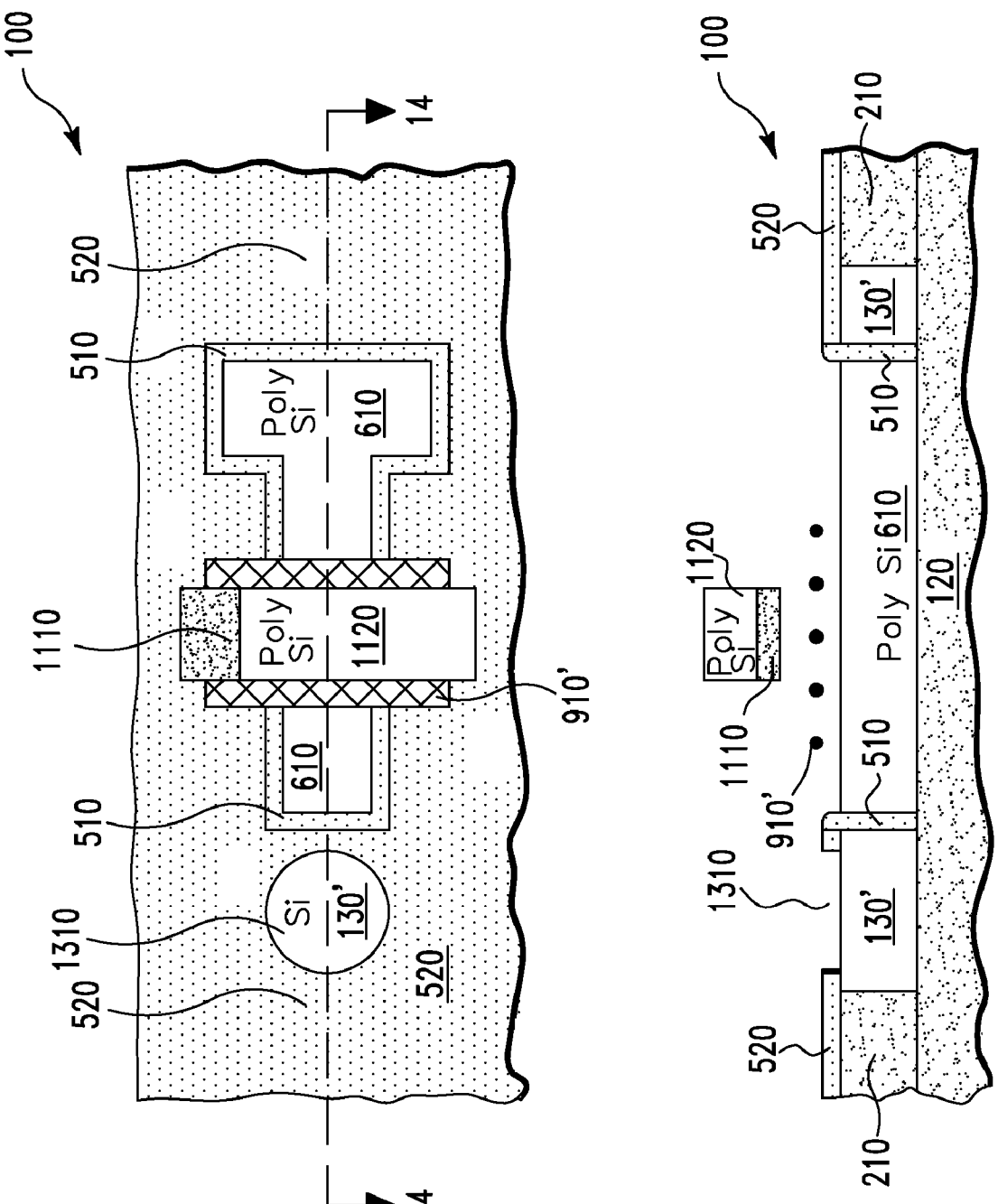

Next, in one embodiment, the top place holder 1010,1020 and the bottom place holder 810 are removed resulting in the memory cell 100 of FIG. 14. In one embodiment, the top place holder 1010,1020 and the bottom place holder 810 comprise Ge and GeO2. As a result, the top place holder 1010,1020 and the bottom place holder 810 can be removed in one wet etch step using $H_2O_2$ & $H_2O$ mixture (hydrogen peroxide and water) resulting in the memory cell 100 of FIG. 14.

With reference to FIG. 14, at this time, the CNT mesh 910' is pinned down to the nitride layer 520 by the oxide region 1110. However, the CNT mesh 910' is electrically insulated from the polysilicon top electrode region 1120 by, among other things, the oxide region 1110. The CNT mesh 910' is also electrically insulated from the polysilicon bottom electrode region 610 by an empty space of the removed Ge bottom place holder 810 (FIG. 13). It should be noted that "empty space" in this application means a space that does not contain solid or liquid materials (i.e., the empty space can comprise gases or nothing).

Figure 15:
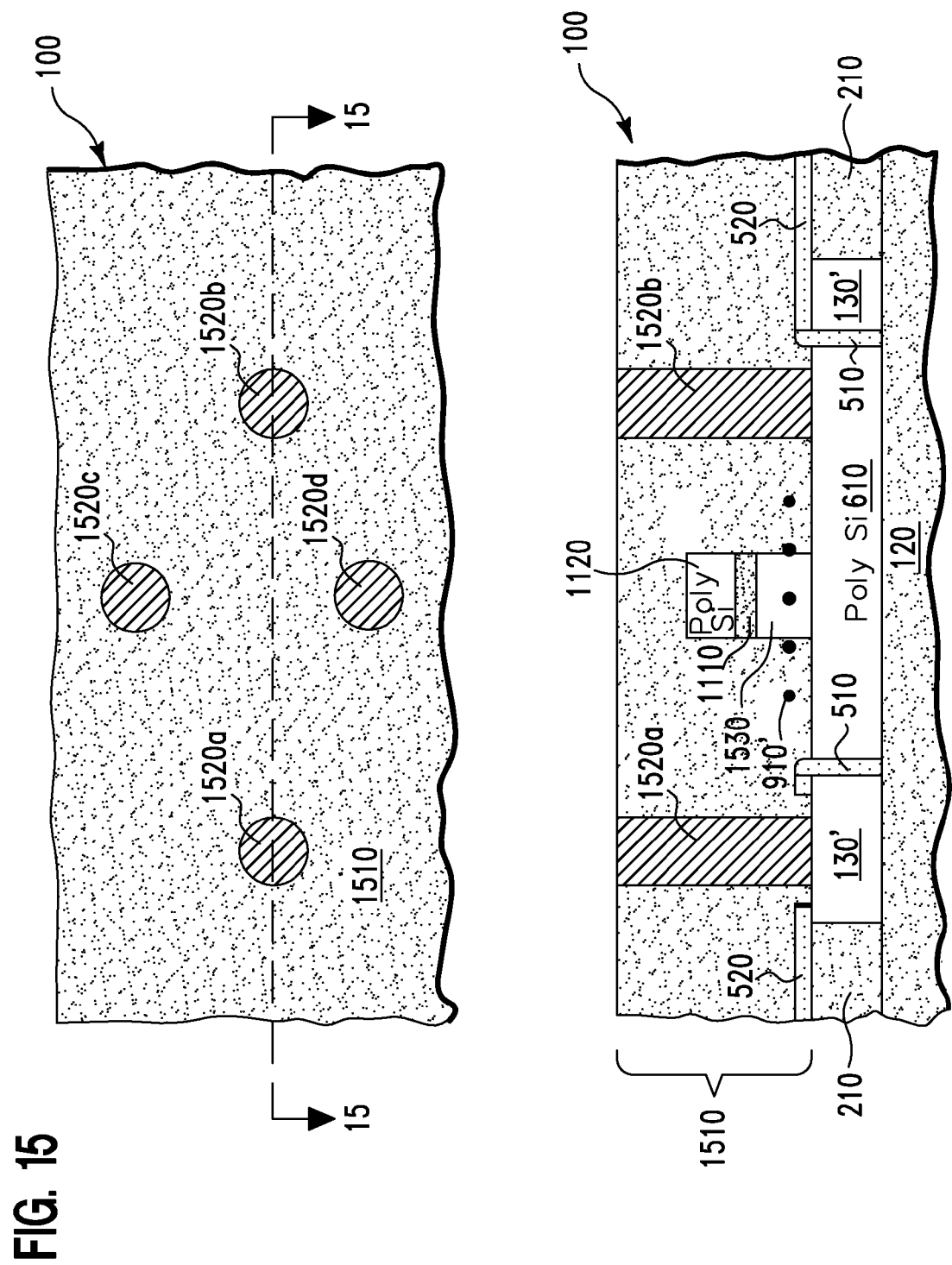

Next, with reference to FIG. 15, in one embodiment, a dielectric layer 1510 (comprising, illustratively, silicon dioxide) is formed on top of the entire memory cell 100 of FIG. 14 such that an empty space 1530 directly beneath the oxide region 1110 remains (i.e., is not filled by deposited oxide material). In one embodiment, the dielectric layer 1510 is formed by a directional deposition of silicon dioxide on top of the entire memory cell 100 of FIG. 14.

Next, in one embodiment, contact holes 1520a, 1520b, 1520c, and 1520d are created in the dielectric layer 1510 such that the silicon region 130', the polysilicon bottom electrode region 610, the CNT mesh 910', and the polysilicon top electrode region 1120 are exposed to the surrounding ambient via the contact holes 1520a, 1520b, 1520c, and 1520d, respectively. Illustratively, the contact holes 1520a, 1520b, 1520c, and 1520d are created using a conventional lithographic and etching process.

Next, in one embodiment, the contact holes 1520a, 1520b, 1520c, and 1520d are filled with a metal (e.g., tungsten W) to form the filled contact holes 1520a, 1520b, 1520c, and 1520d (the same reference numerals are used for simplicity).

Figure 16:
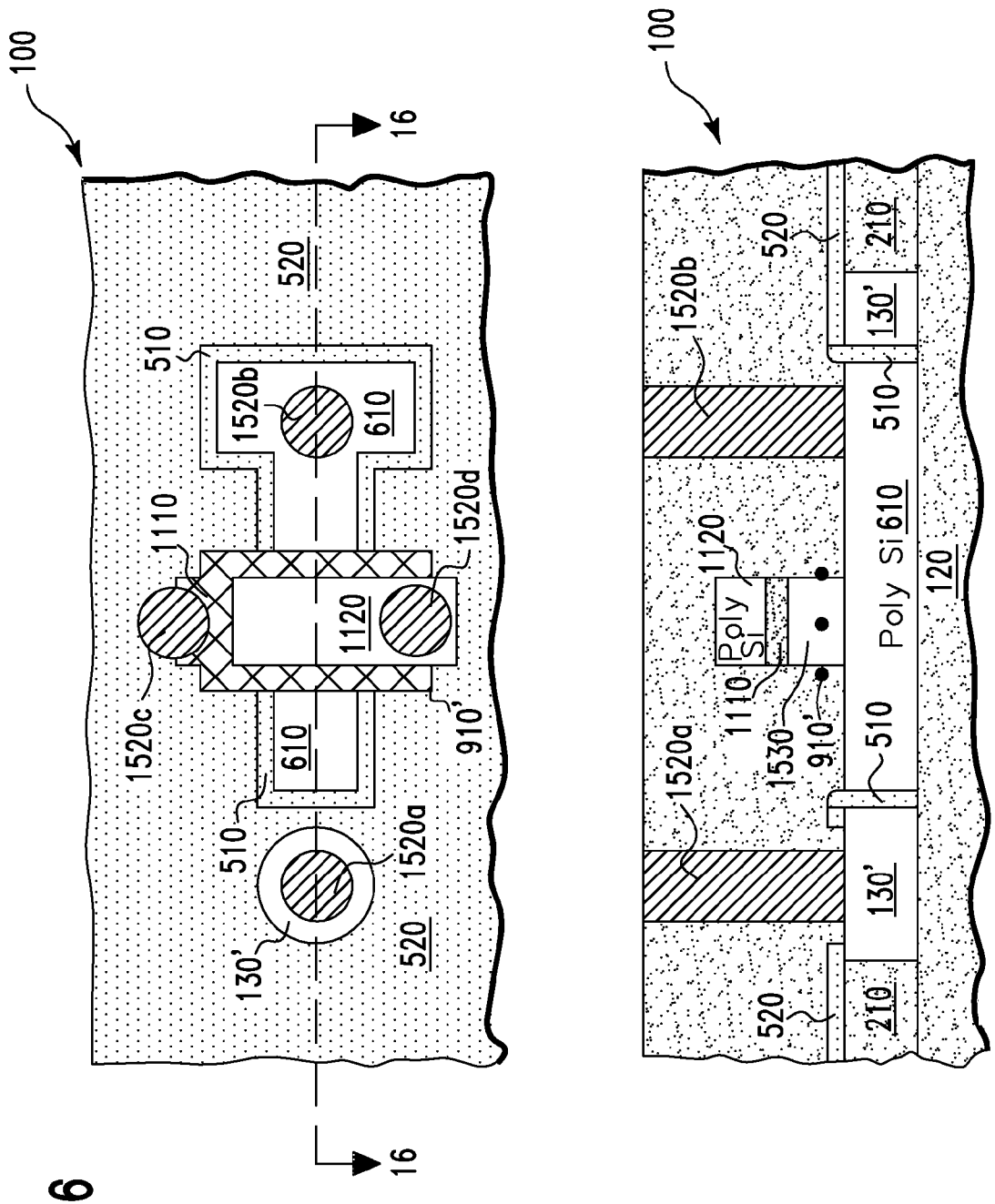

FIG. 16 shows the memory cell 100 of FIG. 15 without the dielectric layer 1510 (FIG. 15) and the oxide region 1110 (FIG. 15). As shown, the filled contact holes 1520a, 1520b, 1520c, and 1520d are in direct physical contact with, and therefore are electrically coupled with, the silicon region 130', the polysilicon bottom electrode region 610, the CNT mesh 910', and the polysilicon top electrode region 1120, respectively. As a result, each of the silicon region 130', the polysilicon bottom electrode region 610, the CNT mesh 910', and the polysilicon top electrode region 1120 can be individually accessed electrically.

In one embodiment, the operation of the memory cell 100 is as follows. To write a 1 into the memory cell 100, a first write voltage potential is applied between the filled contact holes 1520b and 1520c. As a result, a part of the CNT mesh 910' is pulled down towards and comes into direct physical contact with the polysilicon bottom electrode region 610. The CNT mesh 910' retains its shape (i.e., remains in direct physical contact with the polysilicon bottom electrode region 610) even if the first write voltage potential is removed from the filled contact holes 1520b and 1520c. As a result, during a subsequent read cycle, in response to a first pre-specified read voltage potential being applied between the filled contact holes 1520b and 1520c, a first sensing current which can be sensed by a sensing circuit (not shown) flows between the filled contact holes 1520b and 1520c. More specifically, the first sensing current flows through the physical contact between the CNT mesh 910' and the polysilicon bottom electrode region 610, indicating that the memory cell 100 contains a 1.

Similarly, to write a 0 into the memory cell 100, a second write voltage potential is applied between the filled contact holes 1520c and 1520d. As a result, the CNT mesh 910' is pulled away from the polysilicon bottom electrode region 610. It should be noted that the oxide region 1110 (FIG. 15) prevents the CNT mesh 910' from coming into direct physical contact with the polysilicon top electrode region 1120. The CNT mesh 910' retains its shape (i.e., remains not in direct physical contact with the polysilicon bottom electrode region 610) even if the second write voltage potential is removed from the filled contact holes 1520c and 1520d. As a result, during a subsequent read cycle, in response to the first pre-specified read voltage potential being applied between the filled contact holes 1520b and 1520c, the first sensing current described above does not flow between the filled contact holes 1520b and 1520c, indicating that the memory cell 100 contains a 0.

Figure 17:
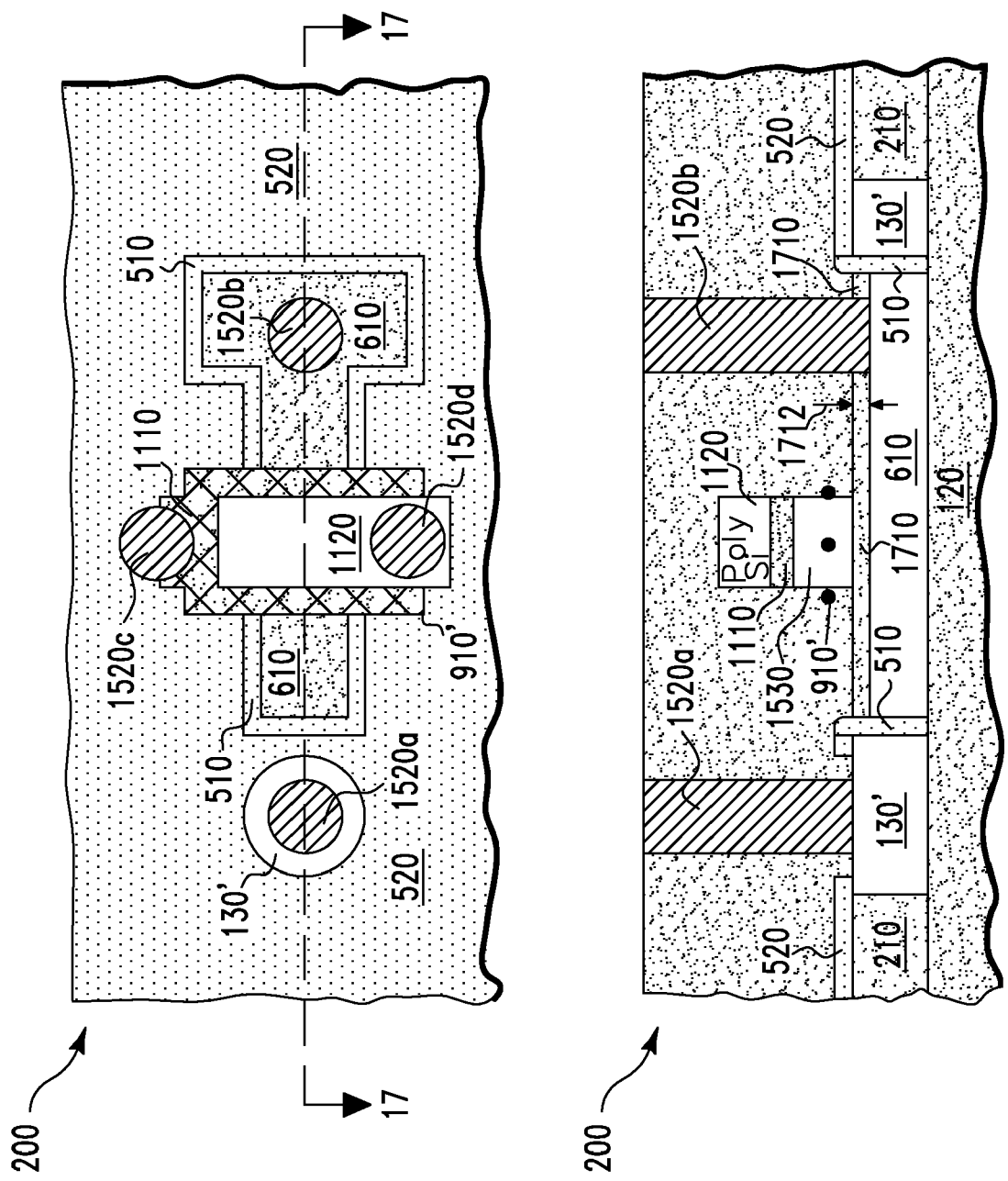
FIG. 17 shows another embodiment of the memory cell of FIG. 15, in accordance with embodiments of the present invention.

FIG. 17 shows a memory cell 200 as an alternative embodiment of the memory cell 100 of FIG. 15, in accordance with embodiments of the present invention. More specifically, the memory cell 200 is essentially the same as the memory cell 100 of FIG. 15, except that the memory cell 200 comprises a tunneling dielectric layer 1710 (comprising silicon dioxide, in one embodiment) on top of the polysilicon bottom electrode region 610 but directly beneath the CNT mesh 910'. In one embodiment, the formation of the a memory cell 200 is similar to the formation of the a memory cell 100 of FIG. 15 described above, except that the tunneling dielectric layer 1710 is formed on top of the polysilicon bottom electrode region 610 of FIG. 7 before the Ge bottom place holder 810 (FIG. 8) is formed on the tunneling dielectric layer 1710.

In one embodiment, the operation of the memory cell 200 is as follows. To write a 1 into the memory cell 200, a third write voltage potential is applied between the filled contact holes 1520b and 1520c. As a result, a part of the CNT mesh 910' is pulled down towards and comes into direct physical contact with the tunneling dielectric layer 1710. The CNT mesh 910' retains its shape (i.e., remains in direct physical contact with the tunneling dielectric layer 1710) even if the third write voltage potential is removed from the filled contact holes 1520b and 1520c. As a result, during a subsequent read cycle, in response to a second pre-specified read voltage potential being applied between the filled contact holes 1520b and 1520c, a second sensing current which can be sensed by a sensing circuit (not shown) flows between the filled contact holes 1520b and 1520c. More specifically, the second sensing current tunnels between the CNT mesh 910' and the polysilicon bottom electrode region 610 through the tunneling dielectric layer 1710, indicating that the memory cell 100 contains a 1.

Similarly, to write a 0 into the memory cell 200, a fourth write voltage potential is applied between the filled contact holes 1520c and 1520d. As a result, the CNT mesh 910' is pulled away from the tunneling dielectric layer 1710. The CNT mesh 910' retains its shape (i.e., remains not in direct physical contact with the tunneling dielectric layer 1710) even if the fourth write voltage potential is removed from the filled contact holes 1520c and 1520d. As a result, during a subsequent read cycle, in response to the second pre-specified read voltage potential being applied between the filled contact holes 1520b and 1520c, said second sensing current described above does not flow between the filled contact holes 1520b and 1520c, indicating that the memory cell 100 contains a 0.

In summary, the use of the top electrode region 1120 and the bottom electrode region 610 allows the memory cells 100 and 200 (FIGS. 15 and 17, respectively) to be reprogrammable multiple times.

It should be noted, with reference to FIG. 17, that the filled contact hole 1520a can be used to electrically connect the silicon region 130' to a diode (not shown) for cell selection or to a source/drain area (not shown) of an FET (field effect transistor) for supporting circuitry.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

The invention claimed is:

1. A structure operation method, comprising:
providing a structure comprising (a) a substrate, (b) a first electrode region and a second electrode region on the substrate, (c) a third electrode region disposed between the first and second electrode regions, and (d) a tunneling dielectric layer disposed between the first and third electrode regions, wherein there exists a force such that in response to the force being applied to the third electrode region, the third electrode region changes its own shape and subsequently retains its changed shape even if the force is no longer present;
applying a first write voltage potential between the first and third electrode regions so as to move portions of the third electrode region towards and into direct physical contact with the tunneling dielectric layer;
after said applying the first write voltage potential is performed, applying a pre-specified read voltage potential between the first and third electrode regions resulting in a sensing current tunneling between the first and third electrode regions through the tunneling dielectric layer; and
using a sensing circuit to sense said sensing current.

2. The method of claim 1, further comprising applying a second write voltage potential between the second and third electrode regions so as to move portions of the third electrode region away from the tunneling dielectric layer such that the third electrode region becomes not in direct physical contact with the tunneling dielectric layer, and such that in response to the pre-specified read voltage potential being subsequently applied between the first and third electrode regions, said sensing current would not tunnel between the first and third electrode regions through the tunneling dielectric layer.

3. The method of claim 1, wherein the third electrode region comprises a carbon nanotube mesh.

4. The method of claim 2, wherein the carbon nanotube mesh comprises multiple carbon nanotubes physically attached together in random orientations.

5. The method of claim 1, wherein the structure further comprises a dielectric region sandwiched between the second and third electrode regions.

* * * * *